United States Patent [19]

Ternes

[11] Patent Number: 4,987,686

[45] Date of Patent: Jan. 29, 1991

[54] STEP AND REPEAT APPARATUS

[75] Inventor: Gretchen Ternes, Shoreview, Minn.

[73] Assignee: Ternes-Burton Company, Roseville, Minn.

[21] Appl. No.: 276,892

[22] Filed: Nov. 28, 1988

[51] Int. Cl.$^5$ ............................................. G01D 21/00
[52] U.S. Cl. ................................................... 33/623
[58] Field of Search .......................... 33/614, 615–623; 355/72, 73, 74, 76, 86, 87, 125; 101/382 MV

[56] References Cited

U.S. PATENT DOCUMENTS 2,983,049 5/1961 Andrisani ............................. 33/623
3,922,087 11/1975 Dillow .................................. 355/87
4,294,539 10/1981 Spehrley .............................. 355/76

FOREIGN PATENT DOCUMENTS 535732 1/1957 Canada .................................. 355/87
1184203 12/1964 Fed. Rep. of Germany ........ 355/73

Primary Examiner—Harry N. Haroian
Attorney, Agent, or Firm—Moore & Hansen

[57] ABSTRACT

The invention comprises a step and repeat board having an upper surface with oriented peaks and valleys.

7 Claims, 1 Drawing Sheet

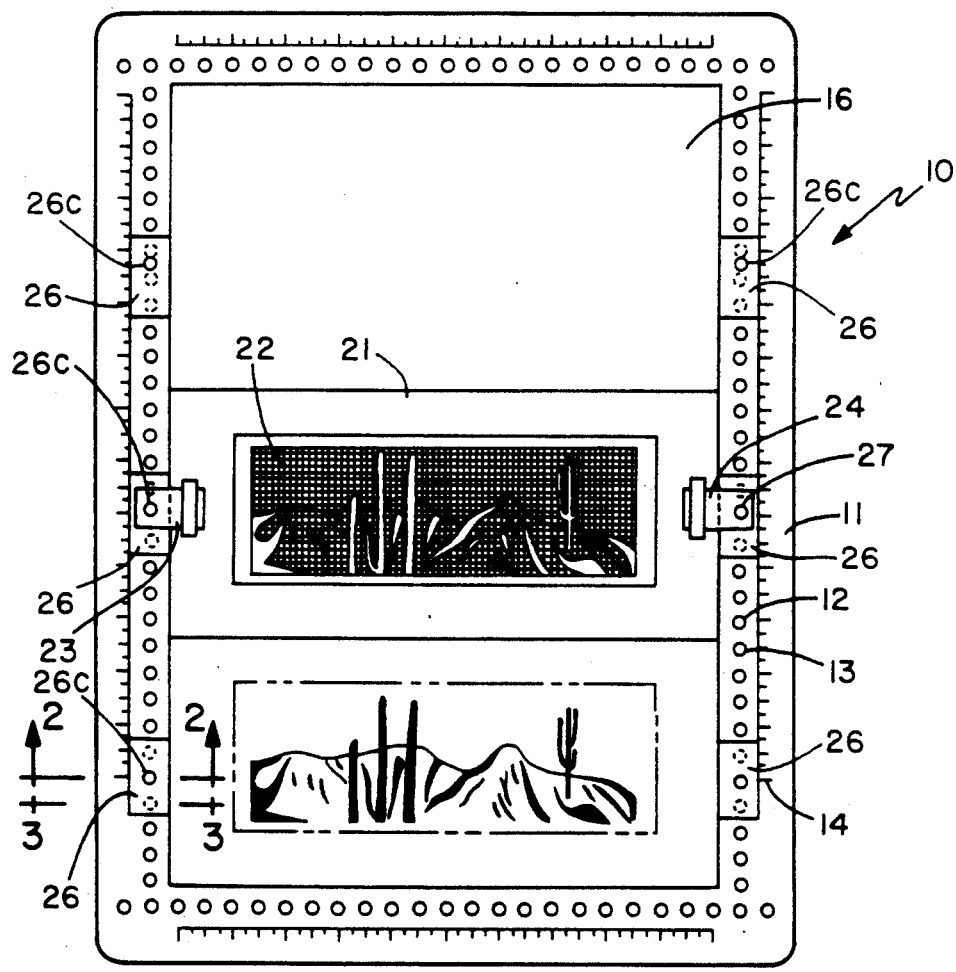
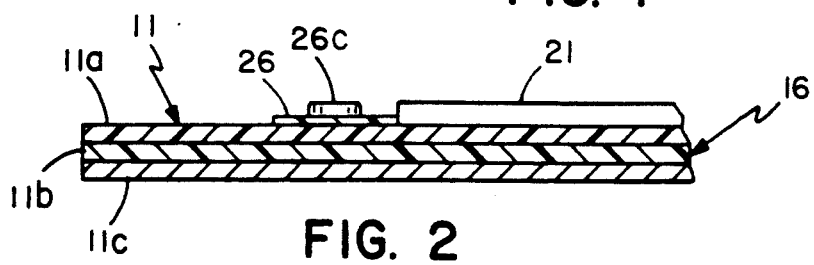
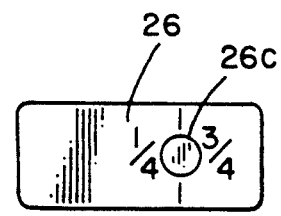
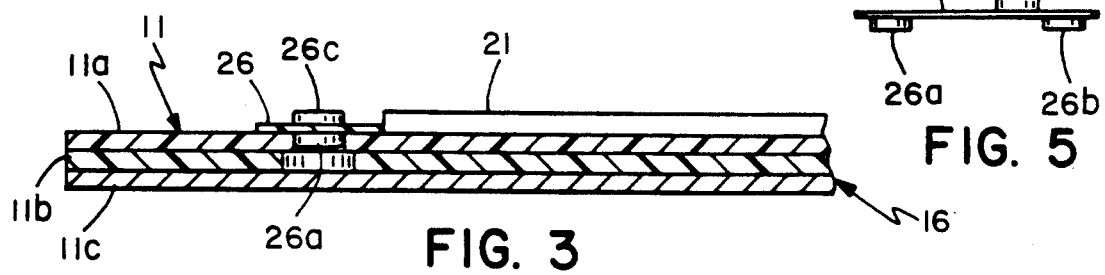
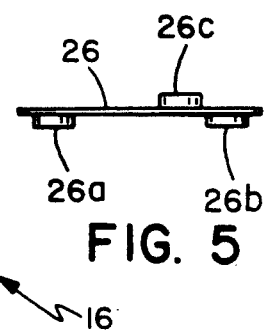

STEP AND REPEAT APPARATUS

FIELD OF THE INVENTION

The present invention relates to apparatus used in preparing printing plates and more particularly to apparatus for positioning an image carrier in a step and repeat type photocomposing process.

BACKGROUND OF THE INVENTION

For many years, lithographic printing has utilized a process known as step and repeat photocomposing. In such a process, rows and columns of aligned images are prepared by stepping an image producing film transparency from position to position. In the past a difficulty was encountered in precisely locating the image producing film transparency in such a manner as to properly locate the various images. Also, in multi-color printing where several colored images are to be reproduced by stepping type of photocomposing, a problem was encountered in registering the film transparencies or the carriers bearing the film transparencies. The problems were at least partially solved by an invention described and claimed in U.S. Pat. No. 2,983,049. The apparatus there described has been highly successful for many years. Certain problems have persisted over the years even with the use of such apparatus. In the operation of the step and repeat apparatus of U.S. Pat. No. 2,983,049, a vacuum is drawn between the step and repeat board and the film transparency. Since the process is repeated many times during the work day, time is of the essence. Therefore, a need for improvement in cycling time has remained. Another problem has been encountered in the vacuum draw-down of the film transparency in which certain areas of the film transparency may be blocked. In other words, a small amount of air remains between the film transparency and the exposing material mounted on the step and repeat board. The lack of perfect vacuumizing creates some surface irregularity and thus the precise contact or exposure of the images to the material to which the images are being transferred.

In the present invention, an improvement was obtained in the rate at which draw-down may be obtained during vacuumizing, for example, improvement of as much as 20–50% over those encountered in the past. The present invention also serves to minimize or eliminate any loss of precise contact thus providing significant improvement in the precision of transferring of images.

GENERAL DESCRIPTION OF THE INVENTION

The present invention relates to a step and repeat apparatus which includes a board that has a plurality of openings aligned adjacent at least one edge. The board desirably has such openings aligned adjacent each of the four edges of the board. The board further includes a bed comprising polymeric material, preferably a vinyl material which has an upper surface with a level hairline cell structure. The hair-line cell structure is comprised of a plurality of peaks and valleys with the valleys being formed between the peaks. The valleys are oriented so that they run in the direction of the board where the vacuum is to be drawn. The vinyl layer is adhered to the board to provide a stable mounting. The vinyl sheet desirably is of a composition that provides a high impact strength, good abrasion resistance, stiffness and hardness. Desirably, the surface is resistant to chemical deterioration. It has been found that acrylic/PVC thermoplastic sheet provides the desired characteristics. The step and repeat board further includes auxiliary equipment including pegs or pins for locating the film transparency in a precise location on the board. The board further includes an aluminum underlayment for purposes of stability, particularly on larger products.

IN THE DRAWINGS

FIG. 1 is a top plan view of a board according to the present invention;

FIG. 2 is a sectional view taken along the lines 2—2 in FIG. 1;

FIG. 3 is an enlarged cross-sectional view taken along the lines 3—3 in FIG. 1;

FIG. 4 is a top plan view of a step and repeat registration pin; and

FIG. 5 is a side view of the step and repeat pin of FIG. 4.

DETAILED DESCRIPTION OF THE PRESENT INVENTION

The step and repeat apparatus 10 of the present invention is illustrated in FIGS. 1–5. The apparatus 10 includes a board 11 that may be constructed of any stable material. For example, it may be of a semi-rigid polyester film sheet material. The board 11 may include a plurality of openings such as 12 and 13 adjacent one edge of the board for purposes hereinafter described. The board may also include a numerical ruler imprinted thereon as illustrated at 14. The board may be multilayered including at least one upper polymeric layer 11a, at least one intermediate polymeric layer 11b and an aluminum layer 11c.

In preferred embodiments of the present invention as illustrated in FIG. 1, the plurality of openings are provided substantially around the perimeter. The openings 12 and 13 are precisely located with respect to one another in order to facilitate accurate registration during use.

The apparatus 10 further includes a bed 16 which may be a vinyl sheet adhered to the board 11. The sheet 16 desirably is of a rigid acrylic/PVC thermoplastic sheet. A commercially available product is Royalite (TM) DKE400 extrusion grain vinyl. The bed 16 may be of any desired thickness, however, typically a sheet having a thickness of about 0.03 inches is deemed appropriate. The bed 16 has an upper surface comprised of peaks and valleys that provide continuous channels across the upper surface of the bed 16. The valleys may have a dimension of at least 0.001 and preferably no greater than 0.008 inches measuring from the height of the peak to the bottom of the valleys, more desirably, 0.003–0.004 inches. The vinyl sheet is desirably of a very high impact strength with good abrasion resistance. This provides durability of the product during use such that irregularities, cuts and dents are not created. Such irregularities would result in lack of good film transparency contact during the step and repeat process. Also, the sheet material desirably is stiff, has a certain degree of hardness with excellent formability. In other words, the surface maintains the peak and valley confirmation without blockage of valleys by deformation.

Auxiliary equipment is used in conjunction with the present step and repeat board 10 as illustrated in FIGS.

1, 4 and 5. FIG. 1 shows a film transparency in place for creating the desired printing image. The auxiliary equipment includes a carrier 21 which has a film transparency 22 mounted therein. The carrier 21 is precisely located with respect to the apparatus 10 through the holding members, commonly known as stripping tabs 23 and 24. The spacer pins 26 and 27 are mounted between the apparatus 10 and the carrier 21. In other words, the downwardly extending pins 26a and 26b are lodged in selected openings in the board 11. The upwardly extending pin 26c is lodged in an opening in the holding member (stripping tab) 23 and a carrier 21 in the registered location. The carrier 21 can be removed, moved to another location on the board 11 and again secured with the spacer pin such as 26.

While a preferred embodiment has been described, various modifications of the invention may be made.

What is claimed is:

1. In an apparatus for positioning a film transparency with respect to a surface, said apparatus including a bed, a registering device arranged along at least one side of said bed and having a length, said registering device having a plurality of indexing holes of like configuration spaced at regular intervals along said length, the improvement wherein said bed comprises:
   at least one vinyl sheet having an exposed upper surface of level hair-line cell structure, said level hair-line cell structure being composed of a plurality of peaks and a plurality of valleys, said plurality of valleys each having an average depth of between 0.001 and 0.008 inches, and further wherein said vinyl sheet has a thickness of about 0.03 inches.

2. The apparatus of claim 1 wherein the plurality of valleys are oriented such that the plurality of valleys extend in a direction generally toward the plurality of indexing holes, whereby a vacuum may be drawn surrounding the exposed upper surface of the bed from said direction when the film transparency is disposed in close proximity above the exposed upper surface.

3. The apparatus of claim 1 wherein said sheet is an acrylic/PVC thermoplastic sheet.

4. An apparatus for positioning a transparency with respect to a surface, said apparatus including a bed, a registering device arranged along at least one side of said bed and having a length, said registering device having a plurality of indexing holes of like configuration spaced at regular intervals along said length, said bed including at least one vinyl layer having an exposed upper surface of level hair-line cell structure, said level hair-line cell structure being composed of a plurality of peaks and a plurality of valleys, said plurality of valleys being generally directionally oriented and each having an average depth of between 0.001 and 0.008 inches.

5. The apparatus of claim 4 wherein the plurality of valleys are oriented in a direction generally toward the registering device, whereby a vacuum may be drawn surrounding the exposed upper surface of the bed from said direction when the film transparency is disposed in close proximity above the exposed upper surface.

6. The apparatus of claim 4 wherein the vinyl layer is a rigid, fire-rated acrylic/PVC thermoplastic sheet.

7. The apparatus of claim 4 wherein the average depth of the plurality of valleys is between 0.003 and 0.004 inches.

* * * * *